United States Patent [19]

Okajima

[11] Patent Number: 4,618,944
[45] Date of Patent: Oct. 21, 1986

[54] SEMICONDUCTOR MEMORY HAVING WORD LINE DISCHARGE CURRENT CONTROLLER

[75] Inventor: Yoshinori Okajima, Yokohama, Japan

[73] Assignee: Fujitsu Limited, Kawasaki, Japan

[21] Appl. No.: 594,276

[22] Filed: Mar. 28, 1984

[30] Foreign Application Priority Data

Mar. 31, 1983 [JP] Japan ................................ 58-053627

[51] Int. Cl.⁴ ............................................. G11C 7/00
[52] U.S. Cl. ................................... 365/189; 365/155; 365/179; 365/190
[58] Field of Search ............... 365/154, 155, 179, 190, 365/226, 180, 189

[56] References Cited

U.S. PATENT DOCUMENTS

4,370,736  1/1983  Takahashi .......................... 365/155
4,464,735  8/1984  Toyoda et al. ...................... 365/190

Primary Examiner—Joseph A. Popek
Attorney, Agent, or Firm—Staas & Halsey

[57] ABSTRACT

A semiconductor memory comprising at least memory cells, word lines ($W_+$, $W_-$), bit lines (BL, $\overline{BL}$) and word line discharge circuits to be co-operated together with a word line discharge current controller. The word line discharge current controller is operative to gradually reduce a word line discharge current absorbed from the word line $W_-$ to the word line discharge circuit together with a gradual attenuation of an inverse current from the bit line to the corresponding memory cell.

8 Claims, 14 Drawing Figures

Fig. 1

PRIOR ART

SEMICONDUCTOR MEMORY HAVING WORD LINE DISCHARGE CURRENT CONTROLLER

BACKGROUND OF THE INVENTION

1. Field of the Invention

The present invention relates to a semiconductor memory. More particularly, the present invention relates to a word line discharge current controller to be incorporated in a semiconductor memory.

2. Description of the Prior Art

Various types of semiconductor memories (hereinafter referred to as memories or memory) have been developed and put into practical use. The present invention refers mainly to a static memory composed of saturation type memory cells. Such memories usually employ word line discharge circuits.

The operation of the word line discharge circuit is such that each word line quickly absorbs electric charges stored along the word line during a change from a selection state to a nonselection state, thereby achieving a higher speed read/write operation in the memory.

It is well known that, in memories composed of saturation type memory cells, the word line level sometimes rises, after a change from the selection state to the nonselection state. This causes a problem wherein, due to this reoccurring rise in the word line level, a deleterious double selection of two word lines takes place simultaneously in the memory. This problem is remarkable in that it occurs every time the word line discharge current is stopped short after the change from the selection state to the nonselection state, and that the word line discharge current flows at every change in state.

SUMMARY OF THE INVENTION

It is an object of the present invention to provide a word line discharge current controller which prevents the aforesaid reoccurrence of the rise in the word line level.

The above object of the present invention is attained by not suddenly stopping the word line discharge current during the change from the selection state to the nonselection state of each word line, but by gradually reducing it to zero together with a gradual attenuation of an inverse current that is flowing from a bit line to a word line ($W_-$) via a corresponding memory cell.

BRIEF DESCRIPTION OF THE DRAWINGS

The present invention will be more apparent from the ensuing description with reference to the accompanying drawings, wherein:

FIGS. 3(a)-(f) are waveform diagrams of the signals appearing in the memory, as an explanation of the present invention;

DESCRIPTION OF THE PREFERRED EMBODIMENTS

Figure 1:
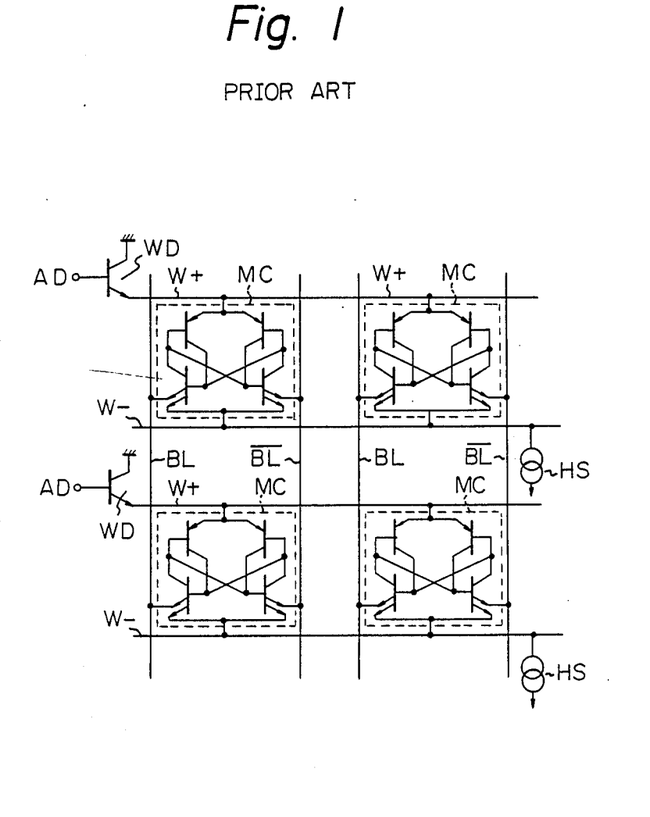
FIG. 1 is a circuit diagram of part of the prior art semiconductor memory to which the present invention is applied.

FIG. 1 is a circuit diagram representing a part of a prior art semiconductor memory to which the present invention is applied. In FIG. 1, characters $W_+$ and $W_-$ denote a word line pair. One end of a first word line $W_+$ is connected to a word driver WD. When an input address AD specifies one of the word drivers WD, and turns it on, the corresponding word line ($W_+$, $W_-$) is changed to the selection state at the "H" (high) level. Following which, the selected bit line pair (BL, $\overline{BL}$) is activated to access the corresponding one of the memory cells MC, located at the cross point between the word line pair and the bit line pair, both of which bit lines (BL, $\overline{BL}$) are in a selection state. Other members identical to $W_+$, $W_-$, MC, WD, BL, and $\overline{BL}$ are arranged in a similar manner in the same chip of the memory device. The second word lines of the word line pairs are connected to the hold current sources HS, which work to hold the data of each memory cell MC as they are until the memory circuit is de-energized. In the thus constructed memory, the aforesaid deleterious double selection often occurs.

Figure 2A:
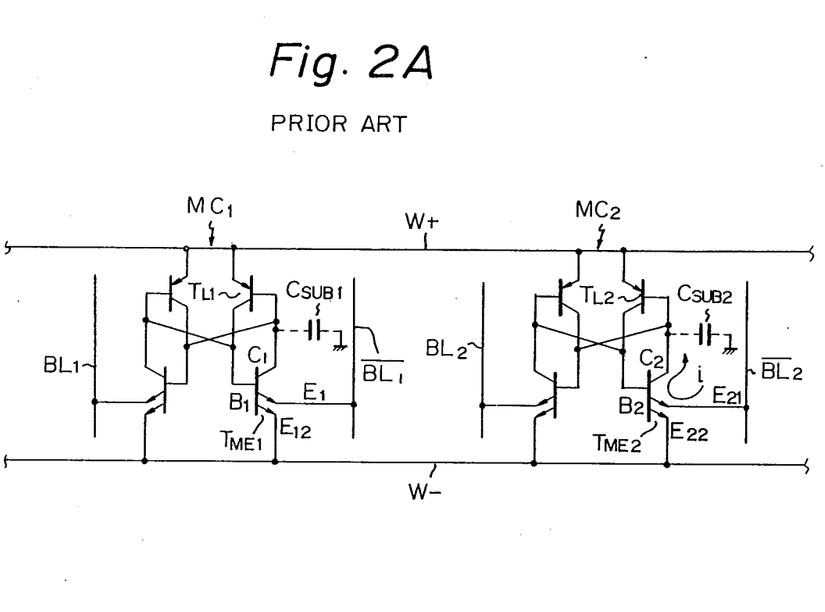
FIG. 2A is an enlarged view of two memory cells representative of the memory cells shown in FIG. 1, as an explanation of the problem of double selection.
Figure 2B:
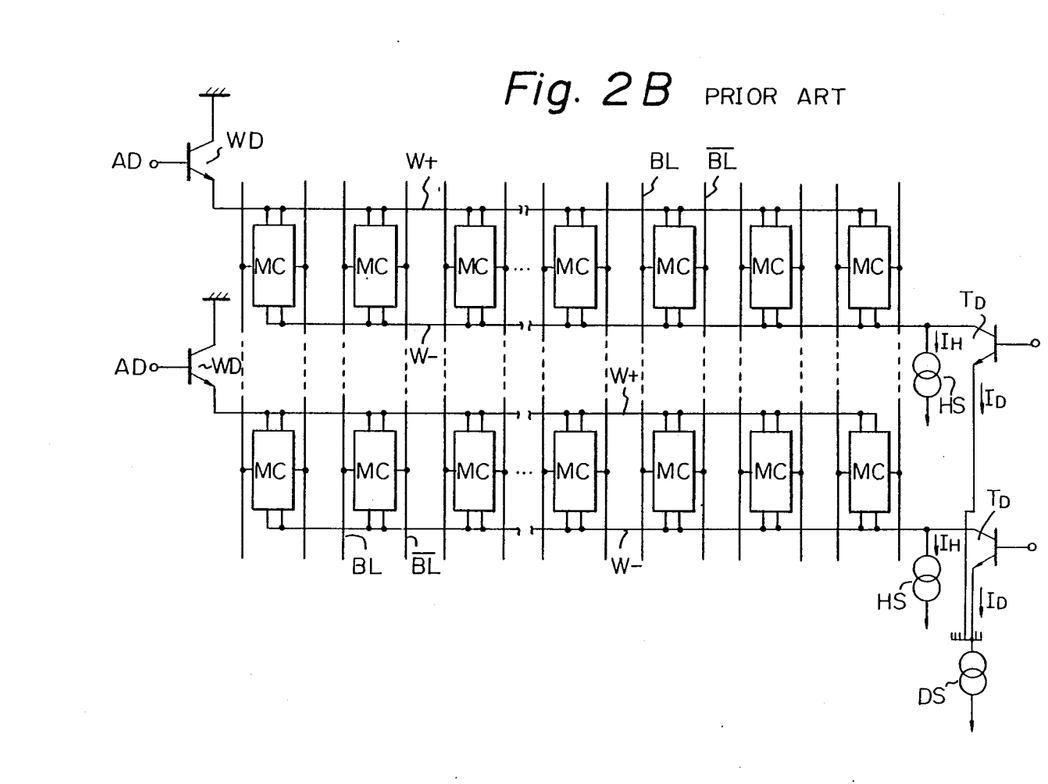
FIG. 2B is a general view of a memory cell arrangement including the two memory cells shown in FIG. 2A.

FIG. 2A is an enlarged view of two memory cells representative of the memory cells shown in FIG. 1, to explain the problem of double selection. While, FIG. 2B is a general view of a memory cell arrangement including the two memory cells shown in FIG. 2A. In FIGS. 2A and 2B (and in other figures), members identical to those of FIG. 1 are represented by the same reference characters.

In FIG. 2A, the memory cell with the suffix 1, such as $MC_1$, $T_{L1}$---, is in the selection state, and the other cell with the suffix 2, such as $MC_2$, $T_{L2}$---, is in a half-selection state. To be in the selection state means that both the word line and bit line pairs are activated, while the half-selection state means that only the word line pair is activated, i.e., the bit line pair is not activated. The above-mentioned double selection is not related to the selection memory cell $MC_1$, but to the half-selection memory cell $MC_2$. In each selected word line, the memory cells, except for one selection memory cell $MC_1$, are all half-selection memory cells $MC_2$. The following explanation will be made referring to the half-selection memory cells $MC_2$ and, specifically, to the right half of such a cell, since the left and right portions are both the same and are arranged almost symmetrically. Character $T_{L2}$ denotes a load transistor and $T_{ME2}$ a multi-emitter transistor. The multi-emitter transistor $T_{ME2}$ has a base $B_2$, a collector $C_2$, a first emitter $E_{21}$, and a second emitter $E_{22}$. The first emitter $E_{21}$ is connected to the first bit line $\overline{BL}$, and the second emitter $E_{22}$ is connected to the second word line $W_-$. The second word line $W_-$ is used for carrying both the aforesaid hold current $I_H$ and the discharge current $I_D$; the latter is absorbed by a word line discharge current source DS shown in FIG. 2B.

The change from the selection state to the non-selection state of the word line ($W_+$, $W_-$) is quickly performed with the aid of the discharge current by means of each discharge current control transistor $T_D$, shown in FIG. 2B. Each current control transistor $T_D$ is conductive during a change of state.

Figure 3:
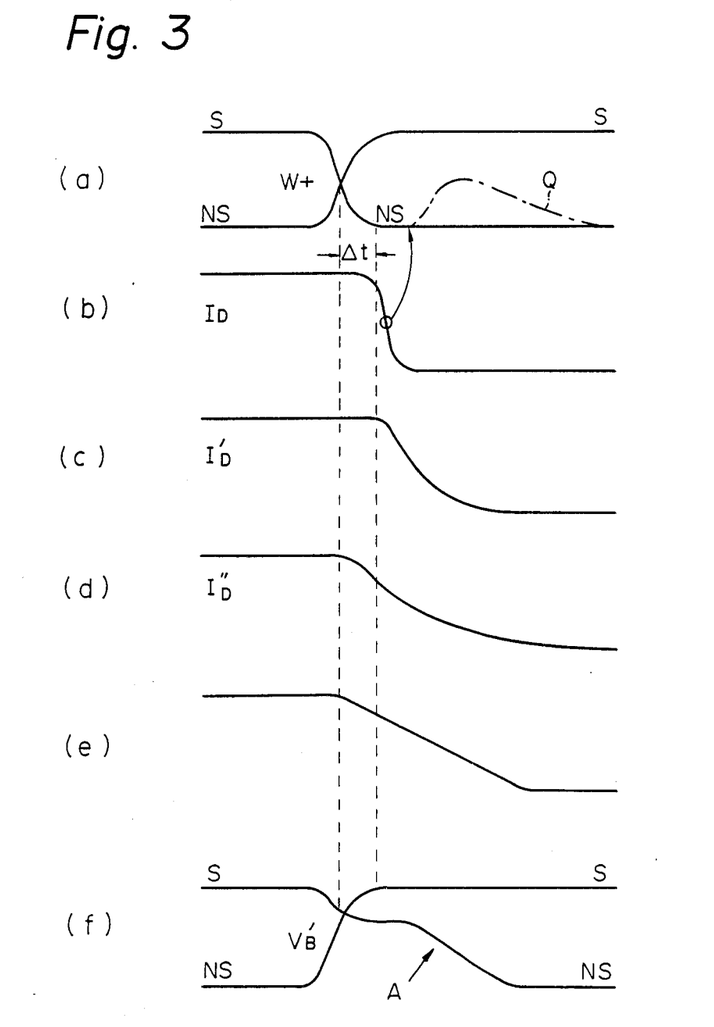

FIG. 3 depicts waveforms of the signals appearing in the memory, as an explanation of the present invention. In FIG. 3, row (a) exhibits changes in the voltage level of the word line $W_+$ when the word line changes from the selection state (referred to in the figure as S), to the nonselection state (referred to in the figure as NS), and vice versa. In this case, the voltage level of the other word line $W_-$ also changes the same way as that of the word line $W_+$. The voltage level at $W_-$ is lower than that of $W_+$ by a certain level caused by the memory cell $MC_2$. The change of state is performed very quickly, particularly during the change from S to NS, due to the presence of the discharge current source DS (FIG. 2B). That is, the source DS largely absorbs the word line discharge current $I_D$ from the word line $W_-$ and the discharge current $I_D$ is then stopped soon after, for the term $\Delta t$, which corresponds to the change of state, by a quick change from on to off state of the discharge current control transistor $T_D$ (FIG. 2B). In this case, the discharge current $I_D$ changes along a curve shown in row (b). Thereby, the electric charges stored in the memory cells, and parasitic capacitors along the word line pair, are quickly removed by the flow of both currents $I_H$ and $I_D$. These currents cause a rapid change from S to NS and, therefore, shorten the access time.

However, it is at this point that the aforementioned problem occurs, wherein the word line level rises again, as schematically illustrated by the chain-dotted line Q of row (a), where the word line discharge current $I_D$ is suddenly stopped a short time ($\Delta t$) after the change "S→NS", as depicted in row (b). This sudden stop of the discharge current $I_D$ occurs because the word line discharge means, i.e. $T_D$'s and DS, of FIG. 2B, forms a so-called current switch. Thus, the deleterious double selection takes place due to the reoccurrence of the rise Q in in the level C between the memory cells of one word line, which changes S→NS, e.g., upper side word line of FIG. 2B, and the memory cells of another word line which changes NS→S, e.g., lower side word line of FIG. 2B. This reoccurrence of the rise Q will be explained below. Since the memory cell $MC_2$ (and also other memory cells) is a saturation type, the multi-emitter transistor $T_{ME2}$ is in a saturation state when it is conductive. In this saturation state, the collector ($C_2$)-base, ($B_2$) junction of the transistor $T_{ME2}$ is turned on in the forward direction, wherein the collector voltage level $V_C$ is lower than the base voltage level $V_B$ by about 0.8 V. Thus, the NPN type transistor $T_{ME2}$ functions in a reverse mode, i.e., the transistor $T_{ME2}$ appears to function as a reverse NPN transistor. This reverse transistor causes an inverse current i which occurs in all of the half-selected memory cells connected to the selected word line. While the discharge current $I_D$ is supplied, however, this inverse current i is drawn through the emitter $E_{22}$. Therefore, if the current drawn from the second emitter $E_{22}$ is stopped (refer to row (b) of FIG. 3), the drawing of inverse current is adversely affected. Since the collector $C_2$ is the substrate itself, the inverse current flows into and charges the related substrate capacitor $C_{SUB2}$. Accordingly, the voltage level of the memory cell $MC_2$ is increased, as a whole, by the charged voltage level. The thus increased voltage level creates the aforesaid reoccurrence of the rise Q shown in row (a) of FIG. 3. Under such circumstances, the sudden stop of the word line discharge current $I_D$, as in the curve of row (b) in FIG. 3, remarkably induces such a rise Q.

To prevent this rise Q, during the inverse operation mode of the multi-emitter transistor $T_{ME2}$, the word line discharge current $I_D$ from the second emitter $E_{22}$ must not be stopped suddenly, but must be allowed to continue flowing for a while. The above-mentioned phrase, "during the inverse operation mode of the multi-emitter transistor" means the period wherein recombinations are performed when the minor carriers thereafter disappear, the minor carriers being stored at the base $B_2$ of the transistor $T_{ME2}$ while it was in the saturation state. Usually the minor carriers disappear gradually, almost following the so-called logarithmic attenuation curve.

In accordance with the above analysis, in the present invention, the word line discharge current is not stopped suddenly, as depicted in row (b) of FIG. 3, but is gradually reduced according to a predetermined discharging characteristic. An example of such a discharging characteristic is depicted by the curve of row (c) in FIG. 3, with a word line discharge current $I'_D$. Alternatively, it is also possible to use a discharging characteristic curve of row (d) in FIG. 3, with a word line discharge current $I''_D$. It may also be possible to reduce the discharge current linearly, as shown in row (e) of FIG. 3.

Figure 4:
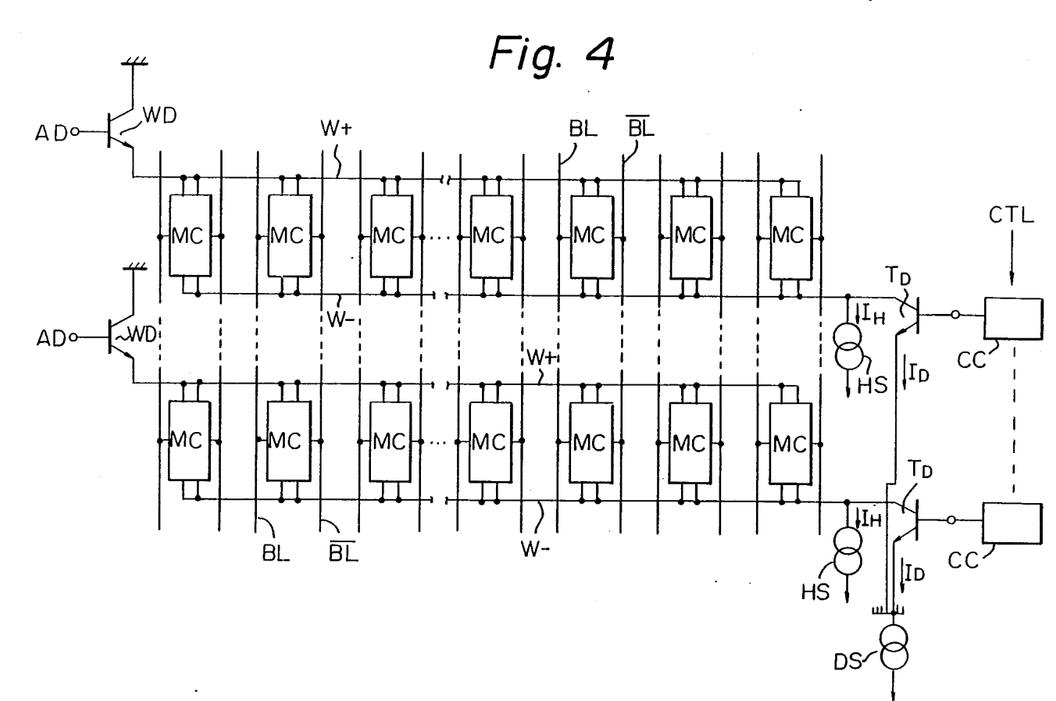
FIG. 4 is a circuit diagram of a semiconductor memory to which a word line discharge current controller has been introduced, according to the present invention.

FIG. 4 is a word line discharge current controller introduced to a semiconductor memory according to the present invention. The controller CTL of the present invention is comprised of control circuits, CC each connected to a respective word line pair. Each control circuit CC is operative to draw the word line discharge current, which is reduced during a short time after the change from the selection state to the nonselection state of the corresponding word line, together with a gradual attenuation of the aforesaid inverse current flowing from the corresponding bit line to the corresponding word line $W_-$. Thereby realizing any one of the discharging characteristics depicted in rows (b) through (e).

Figure 5:
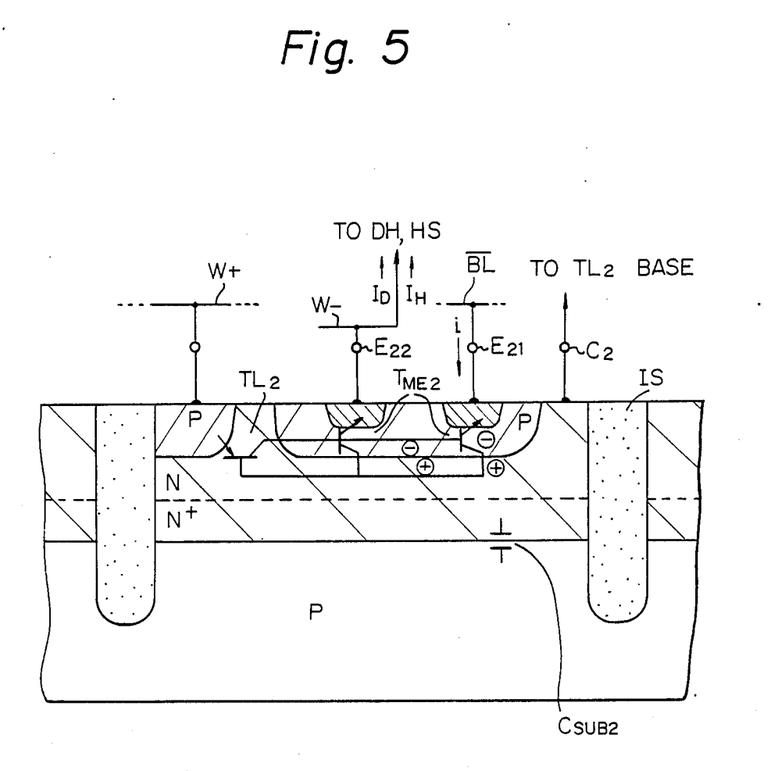
FIG. 5 is an enlarged cross-sectional view of a part of the memory cell $MC_2$ shown in FIG. 2A.

FIG. 5 is an enlarged cross-sectional view of a part of the memory cell $MC_2$ shown in FIG. 2A. The principle according to the present invention as described previously will be explained in more detail, with reference to FIG. 5, to clarify the role of each control circuit CC of FIG. 4.

The emitter of the load transistor $T_{L2}$ is connected to the word line $W_+$, the collector is connected to the base of the multi-emitter transistor $T_{ME2}$, and the base is connected to the collector of the transistor $T_{ME2}$. All are surrounded by an isolation region IS. The word line discharge current $I_D$ is drawn from the second emitter $E_{22}$ of the transistor $T_{ME2}$ to the word line $W_-$. Since the transistor $T_{ME2}$ is saturated during the selection state, the base-collector junction of the transistor $T_{ME2}$ is made on. Therefore, the electric charges $\oplus$ and $\ominus$ are stored separately along the border of the base-collector junction, as illustrated. In this case, the transistor having the emitter $E_{21}$ is operated in the aforesaid inverse operation mode and the aforesaid inverse current i flows therethrough due to the "H" level of the bit line $\overline{BL}$ and to the inverse on state of the transistor according to the presence of the stored charges ⊕ and ⊖. The inverse current i is proportional to the total of the currents $I_H+I_D$. When the current $I_D$ is stopped suddenly, as depicted in row (b) of FIG. 3, the inverse current i can no longer be discharged with the current $I_D$, and accordingly, flows into the substrate capacitor $C_{SUB2}$, which causes the aforesaid reoccurrence of the rise Q (row (a) in FIG. 3). The inverse current i continues to flow until the inverse transistor, having the emitter $E_{22}$, is turned off. The change from on to off gradually advances almost in line with an advance of the recombination of the charges ⊕ and ⊖. This change advances according to a known recombination characteristic, expressed as the following function, $$N(t)=Ne^{-(t/\tau)},$$

where N denotes an initial density of the charges (time t=0), e denotes a Naperian logarithm base, and $\tau$ denotes a time constant. Therefore, to prevent the rise Q, the discharge current $I_D$ must not be stopped suddenly, but by gradually following the above recited function N(t). That is, the inverse current i must be further drawn toward the word line $W_-$ and, along with the gradually reducing discharge current $I_D$, until the stored charges disappear. In other words, the current $I_D$ must be gradually reduced together with a gradual attenuation of the inverse current flowing from the bit line BL to the word line $W_-$. Regarding the selection memory cell, such a gradual reduction of the current $I_D$ is not effective, since no inverse current i flows. This is because the selection memory cell is connected with the bit line pair which is at the "L" (low) level.

Figure 6:
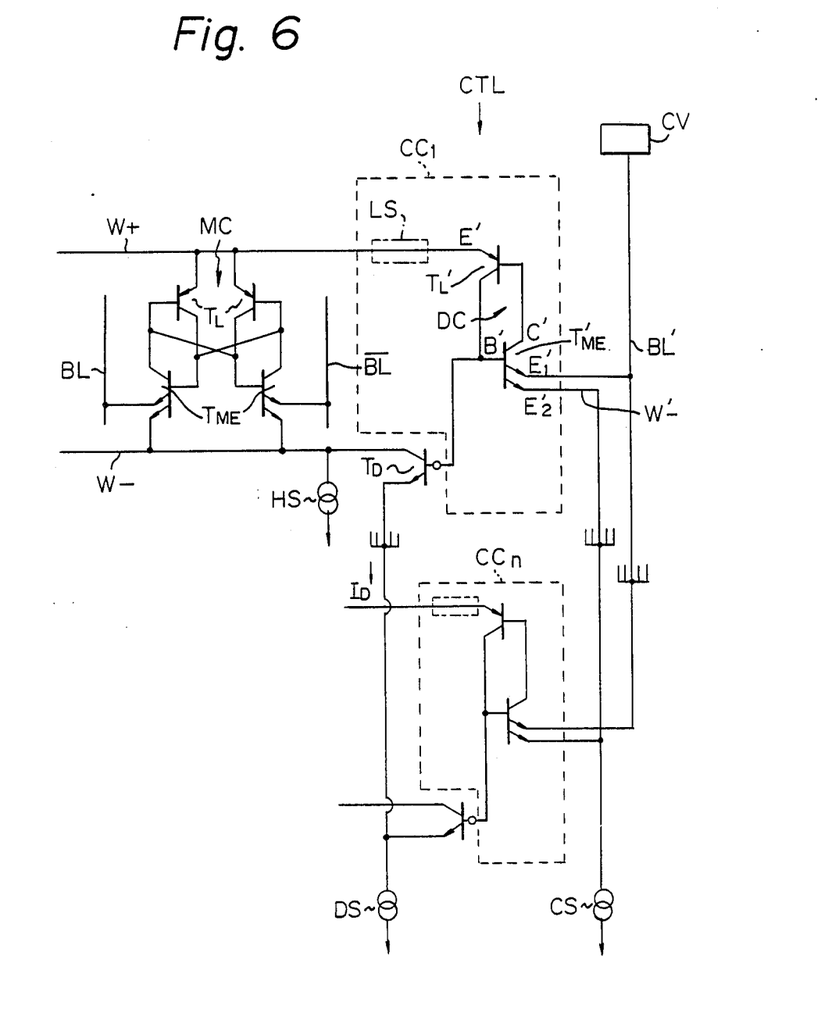
FIG. 6 is a circuit diagram of the controller CTL of FIG. 4 according to an embodiment of the present invention.

FIG. 6 is circuit diagram of the controller CTL of FIG. 4 according to a preferred embodiment of the present invention. In FIG. 6, only the top side control circuit $CC_1$ of the controller CTL and the bottom side control circuit $CC_n$ shown for simplicity. Each control circuit has the same circuit arrangement.

Taking the top side control circuit $CC_1$ as being representative, this control circuit $CC_1$ is comprised of a dummy cell DC. The term "dummy" means a copy of a right (or left) half of the memory cell MC. That is, the dummy cell DC is comprised of a dummy load transistor $T_L'$ and a dummy multi-emitter transistor $T_{ME}'$. The transistor $T_L'$ is connected at its dummy emitter E' to the first word line $W_+$. The transistor $T_{ME}'$ is connected at its dummy first emitter $E'_1$ to a dummy bit line BL' and at its dummy second emitter $E'_2$ to a dummy second word line $W_-'$. The dummy base B' and the dummy collector C' of the transistor $T_{ME}'$ are connected to the collector and the base of the transistor $T_L'$, respectively. CV denotes a constant voltage source for creating a state equivalent to the state of the selected bit line. CS denotes a constant current source for drawing a discharge current, as does the word line discharge current source DS.

The operations are as follows. The voltage level at the dummy emitter E' of the dummy load transistor $T_L'$ varies together with the variation in voltage level of the first word line $W_+$. When the word line $W_+$ is selected and is at the "H" level, the dummy cell DC is active with respect to the constant current source CS. That is, the dummy cell DC is turned on. Next, when the illustrated word line pair ($W_+$, $W_-$) is not specified by the input address AD (FIG. 1), the concerned word line pair is changed from the selection state to the nonselection state. During this change, the aforesaid reoccurrence of the rise Q (refer to row (a) of FIG. 3) takes place in each of the half-selection memory cells MC pertaining to the concerned word line pair. The identical rise Q also takes place in the dummy cell DC, simultaneously. At this time, the inverse current i flows into the substrate capacitor ($C_{SUB}$) in the dummy cell DC, and also into each half-selection memory cell MC. The rise Q in the cell DC pushes the base voltage level $V'_B$ of the transistor $T_{ME}'$ upward. Such an irregular rise of $V'_B$ is depicted as a step like waveform A in row (f) of FIG. 3. In this case, the discharge current control transistor $T_D$ is fully biased by the increased voltage level $V'_B$, and accordingly, the word line discharge current $I_D$ continues to flow through the transistor $T_D$ which is still maintained on by the biasing voltage $V'_B$. Here, it is important to note that the voltage level $V'_B$ varies in accordance with the variation of the rise Q. As a result, the discharge current $I''_D$ (row (d) of FIG. 3) is obtained as intended, the current $I''_D$ having the characteric curve approximated by the previously recited function $$N(t)=Ne^{-(t/\tau)}$$

The controller CTL of FIG. 6 produces the following two advantages. First, as mentioned above, the waveform of the current $I''_D$ exhibits the same or close to the ideal decreasing curve defined by N(t), and second, the uniform capability of the gradual reduction of $I_D$ is always maintained regardless of differences in the production lot. This is because the dummy cells DC are fabricated by the same process as that of the memory cells MC.

Referring to FIG. 6, LS denotes a level shifter. The level shifter LS assures the current draw of $I''_D$ via the control transistor $T_D$. Current $I''_D$ cannot flow totally in the transistor $T_D$ when the transistor $T_D$ operates in a saturation state. Therefore, the transistor $T_D$ is preferably operated under a non-saturation state. The non-saturation state can be easily created by reducing the base voltage level $V'_B$ by a certain amount. Since the level $V'_B$ is determined from the word line ($W_+$) voltage level with a voltage drop across the dummy cell DC, the level $V'_B$ can be lowered by inserting the level shifter between the word line $W_+$ and the base of the transistor $T_D$, preferably between the line $W_+$ and the dummy emitter E' of the transistor $T'_L$, as illustrated.

Figure 7A:
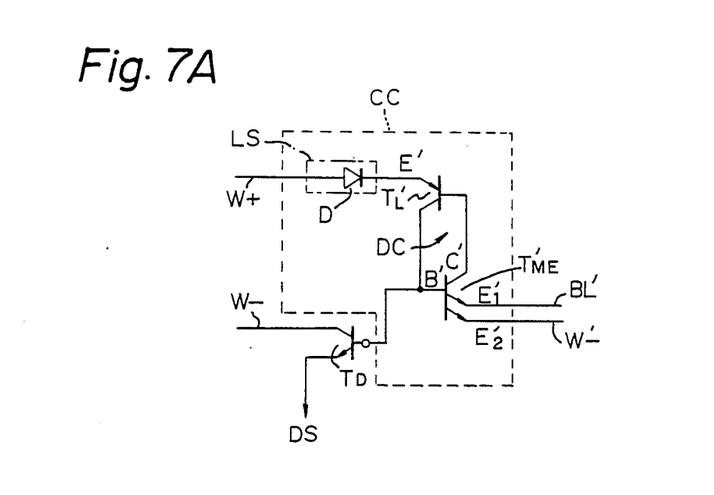
FIG. 7A is a circuit diagram of the control circuit CC shown in FIG. 6, including the level shifter LS of FIG. 6 according to a first embodiment.

FIG. 7A is a circuit diagram of the control circuit CC shown in FIG. 6, including the level shifter LS of FIG. 6 according to a first example. In the first example, the level shifter is composed of a diode C.

Figure 7B:
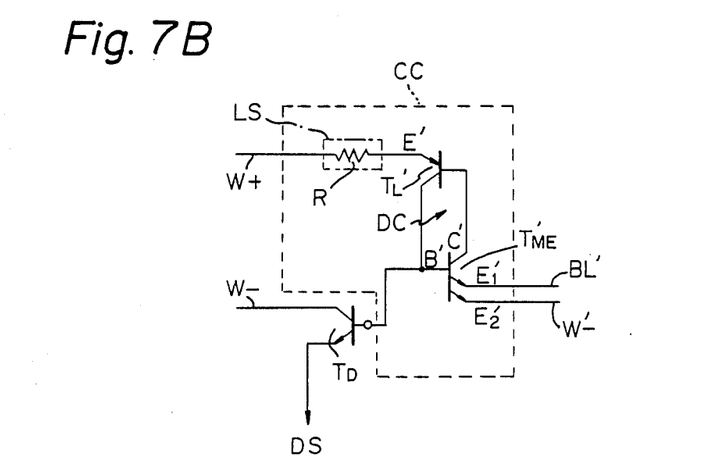
FIG. 7B is a circuit diagram of the control circuit CC shown in FIG. 6, including the level shifter LS of FIG. 6 according to a second embodiment.

FIG. 7B is a circuit diagram of the control circuit CC shown in FIG. 6, including the level shifter LS of FIG. 6 according to a second example. In the second example the level shifter LS is composed of a resistor R.

As explained above in detail, the controller CTL of the present invention can prevent deleterious double selections occurring between first half-selection memory cells of one word line pair which changes from the selection state to the nonselection state, and second half-selection memory cells of another word line which changes from the nonselection state to the selection state.

I claim:

1. A semiconductor memory comprising:
a plurality of word line pairs;
a plurality of bit line pairs intersecting said plurality of word line pairs;

a plurality of memory cells respectively connected at the intersections of said word line pairs and said bit line pairs, an inverse current flowing from said bit lines to said memory cells;

a word line discharge circuit, operatively connected to said word line pairs, for absorbing a discharge current from said word line pairs during a change from a selection state to a nonselection state of said word line pairs; and control means, operatively connected to said word line discharge circuit, for controlling the discharge current so as to be gradually reduced together with a gradual attenuation of the inverse current flowing from one of said bit lines to one of said memory cells, the waveform of the discharge current approximating an exponential characteristic curve.

2. A semiconductor memory as set forth in claim 1, having hold current sources, a word line discharge current source, and discharge current control transistors operatively connected to the word line discharge current source, wherein said plurality of bit line pairs have first and second bit lines, said semiconductor memory further comprising:

a plurality of word drivers operatively connected to respective first word lines of said word line pairs, respective second word lines of said word line pairs being operatively connected to said hold current sources and the discharge current control transistors;

wherein each of said plurality of word line pairs has a first word line operatively connected to a respective one of said word drivers, and a second word line operatively connected to a respective one of the hold current sources and to a respective one of the discharge current control transistors;

wherein each of said memory cells includes two identical transistor sets including a load transistor connected to said corresponding first word lines and a multi-emitter transistor having a first emitter connected to said corresponding first bit lines and having a second emitter connected to said corresponding second word lines; and wherein said control means is operatively connected to respective discharge control transistors, said control means producing a control signal to be applied to the base of each of the discharge current control transistors, said control means including control circuits, respectively, operatively connected to said word line pairs, said control circuits being operative, by cooperating with a corresponding one of the discharge control transistors, to gradually reduce the word line discharge current and to gradually attenuate each inverse current flowing through the first emitter of said multi-emitter transistor of each of said memory cells in the half-selection state during a change from a selection state to a nonselection state.

3. A semiconductor memory as set forth in claim 2, wherein:

each said control circuit includes a dummy cell which comprises a dummy load transistor and a dummy multi-emitter transistor;

both said dummy transistors are copies of said load transistor and said multi-emitter transistor of said memory cell, respectively;

the first emitter and the second emitter of said dummy multi-emitter transistor are operatively connected to a dummy bit line and a dummy second word line, respectively; and the emitter of said dummy load transistor is operatively connected to said first word line.

4. A semiconductor memory as set forth in claim 3, wherein each of said control circuits further comprise a level shifter operatively connected to the emitter of said dummy load transistor.

5. A semiconductor memory as set forth in claim 4, wherein said level shifter comprises a diode.

6. A semiconductor memory as set forth in claim 5, further comprising a constant voltage source and a constant current source, wherein said dummy bit line has one end operatively connected to said constant voltage source, and said dummy second word line has one end operatively connected to said constant current source.

7. A semiconductor memory as set forth in claim 4, wherein said level shifter comprises a resistor.

8. A semiconductor memory as set forth in claim 7, further comprising a constant voltage source and a constant current source, wherein said dummy bit line has one end operatively connected to said constant voltage source and said dummy second word line has one end operatively connected to said constant current source.

* * * * *

UNITED STATES PATENT AND TRADEMARK OFFICE
CERTIFICATE OF CORRECTION

PATENT NO. : 4,618,944
DATED      : OCTOBER 21, 1986
INVENTOR(S): YOSHINORI OKAJIMA

It is certified that error appears in the above-identified patent and that said Letters Patent is hereby corrected as shown below:

```
Col. 3, line 7, after "Each" insert --discharge--;
        line 44, delete "Q in";
        line 44, "C" should be --Q--.

Col. 5, line 23, (line numbering off), delete "and,";
        line 33, (line numbering off), after "is" insert
                 --a--;
        line 48, after "BL'" insert --,--.

Col. 8, line 44, after "source" insert --,--.
```

Signed and Sealed this

Twentieth Day of January, 1987

*Attest:*

DONALD J. QUIGG

*Attesting Officer*       *Commissioner of Patents and Trademarks*